(12) United States Patent
Berglund et al.

(10) Patent No.: US 11,996,474 B2
(45) Date of Patent: May 28, 2024

(54) SEMICONDUCTOR DEVICE AND METHOD OF MANUFACTURE

(71) Applicant: NEXPERIA B.V., Nijmegen (NL)

(72) Inventors: Stefan Berglund, Nijmegen (NL); Steffen Holland, Nijmegen (NL)

(73) Assignee: Nexperia B.V., Nijmegen (NL)

(*) Notice: Subject to any disclaimer, the term of this patent is extended or adjusted under 35 U.S.C. 154(b) by 159 days.

(21) Appl. No.: 16/704,577

(22) Filed: Dec. 5, 2019

(65) Prior Publication Data

US 2020/0185513 A1    Jun. 11, 2020

(30) Foreign Application Priority Data

Dec. 6, 2018 (EP) ..................................... 18210783

(51) Int. Cl.
   *H01L 29/737* (2006.01)
   *H01L 29/47* (2006.01)
   *H01L 29/66* (2006.01)

(52) U.S. Cl.
   CPC .......... *H01L 29/7375* (2013.01); *H01L 29/47* (2013.01); *H01L 29/66272* (2013.01)

(58) Field of Classification Search
   CPC ....... H01L 29/73–7398; H01L 29/7375; H01L 29/47; H01L 29/66272; H01L 29/7322; H01L 29/732; H01L 29/0804
   See application file for complete search history.

(56) References Cited

U.S. PATENT DOCUMENTS

| 5,541,124 | A | | 7/1996 | Miwa et al. |
| 5,912,479 | A | * | 6/1999 | Mori ..................... H01L 29/802 257/195 |
| 5,966,618 | A | * | 10/1999 | Sun ................... H01L 21/76221 438/452 |
| 6,171,920 | B1 | * | 1/2001 | El-Sharawy ........ H01L 29/7378 257/E29.081 |
| 6,686,250 | B1 | | 2/2004 | Kalnitsky et al. |
| 2001/0017399 | A1 | | 8/2001 | Oda et al. |
| 2002/0076893 | A1 | | 6/2002 | Howard et al. |
| 2007/0134854 | A1 | * | 6/2007 | Zhang ............... H01L 21/82285 438/142 |
| 2007/0176254 | A1 | * | 8/2007 | Liu ..................... H01L 29/7375 257/E29.345 |
| 2009/0057685 | A1 | | 3/2009 | Mochizuki et al. |
| 2009/0250724 | A1 | * | 10/2009 | Ellis ................... H01L 29/7378 257/E29.174 |
| 2010/0025808 | A1 | * | 2/2010 | Donkers ............. H01L 29/7378 257/E21.372 |

(Continued)

OTHER PUBLICATIONS

Ghosh et al., "An Arsenic Emitter Structure for High-Performance Silicon Transistors"; IBM Journal of Research and Development, vol. 15, Issue: 6 (Year: 1971).*

(Continued)

*Primary Examiner* — Mohammad A Rahman
(74) *Attorney, Agent, or Firm* — Ruggiero McAllister & McMahon LLC

(57) ABSTRACT

The present disclosure relates to a bipolar transistor semiconductor device including: a substrate layer, a collector epitaxial layer supported by the substrate layer, a base region supported by a portion of the collector epitaxial layer, and an emitter region supported by a portion of the base region. The emitter region includes a polysilicon material.

13 Claims, 5 Drawing Sheets

(56) References Cited

U.S. PATENT DOCUMENTS

| | | | |
|---|---|---|---|
| 2011/0140239 A1 | 6/2011 | Chiu et al. | |
| 2011/0220963 A1* | 9/2011 | Chuang | H01L 29/66272 |
| | | | 257/140 |
| 2012/0056305 A1* | 3/2012 | Kuo | H01L 29/7371 |
| | | | 257/E29.174 |
| 2016/0071972 A1* | 3/2016 | Krischke | H01L 29/7803 |
| | | | 257/334 |

OTHER PUBLICATIONS

Crabbe et al., ("73-GHz self-aligned SiGe-base bipolar transistors with phosphorus-doped polysilicon emitters", IEEE Electron Device Letters, vol. 13, Issue: 5 (Year: 1992).*

Extended European Search Report and Written Opinion for corresponding European application EP18210783.9, 7 pages, dated Jun. 26, 2019.

* cited by examiner

SEMICONDUCTOR DEVICE AND METHOD OF MANUFACTURE

CROSS REFERENCE TO RELATED APPLICATIONS

This application claims the benefit under 35 U.S.C. § 119(a) of European Application No. 18210783.9 filed Dec. 6, 2018 the contents of which are incorporated by reference herein in their entirety.

BACKGROUND OF THE DISCLOSURE

1. Field of the Disclosure

The present disclosure relates to a semiconductor device, a method of fabricating the same and an electronic device including the semiconductor device. More specifically, the disclosure relates to a bipolar junction transistor (BJT) semiconductor device also referred to as a bi-polar transistor.

2. Description of the Related Art

A bipolar transistor is commonly used for current amplification in both analogue and digital circuits. In its simplest form, as shown in FIG. 1, a discrete NPN bipolar transistor 100 comprises an emitter region 101 electrically coupled to an emitter terminal 101a, a collector region 103 electrically coupled to a collector terminal 103a and a base region 102 electrically coupled to a base terminal 102a. When configured in the common emitter mode, such a bipolar transistor 100 may be operated as a current amplifier such that small changes to the input base current $I_B$ may result in large changes to the output collector/emitter current $I_C$.

The current amplification characteristics of a bipolar transistor are governed by the current gain or amplification factor hFE, also referred to as β. The magnitude of the amplified output collector/emitter current IC is typically defined by the product of the hFE of the bipolar transistor and the base current IB.

Typically, high current gain hFE characteristics are preferred such that the bipolar transistor can enter device saturation at high collector current, driven only by a small base current. Conventional BJTs generally have hFE values that range from approximately 10 to 500.

A conventional discrete bipolar transistor device structure comprises a diffused emitter and base formed within a collector epitaxial layer. The emitter and base contact terminals are located on the device wafer front portion 104 and a collector terminal is located on the wafer back portion 105.

In order to achieve a bipolar transistor with a high hFE, a high emitter Gummel number has to be achieved for the device. The emitter Gummel number, a parameter used to measure the emitter efficiency of a transistor and relating to the effective doping of the emitter, is limited by bandgap narrowing and carrier lifetime. A detailed discussion of the application of Gummel number in transistor design is not within the scope of the present disclosure as the skilled person will be aware that this parameter may be used to evaluate and aid in the process of bipolar transistor design. In addition, a low base Gummel number is also required for the bipolar transistor. This number relates to the total base doping and is limited by the breakdown voltage BVCBO. BVCBO is the collector-to-base breakdown voltage with emitter floating. A limitation is that the base must contain a total critical doping to contain the depletion zone of BVCBO, otherwise punch-through occurs.

Accordingly, to achieve high hFE for a bipolar transistor, the emitter has to be highly doped and the base lowly doped and/or as narrow in width as possible.

To achieve bipolar transistors with hFE values of 700 or greater, traditional processes are limited by the maximum effective emitter dopant achievable and the process spread (that is, variations in properties/characteristics between and within devices) associated with generating a lowly doped and narrow base. In practice the base width may become very difficult to control for a narrow base. The emitter diffuses faster as the base of the transistor since its doping is higher. As such, for a very narrow base, the slightest variation in doping will result in an uneven distribution of the base region. The uneven distribution of the base will worsen for a given time in the furnace as the base gets narrower.

Applying known processes, discrete bipolar transistors with hFE of 1000 or higher may be manufactured, but it will be at the expense of compromising the performance of the device such as having to accept a large process spread (i.e. due to having a lowly doped and narrow base) resulting in substantial yield loss or having to use a Darlington transistor arrangement, which makes it impossible for the transistor to enter saturation (as it prevents VBC from shifting polarity), which can limit the maximum current the transistor can conduct thereby limiting the rating of the device.

It is generally known that polysilicon emitter based transistors may be applied in integrated chips ICs for high frequency applications. Typically, such transistors deployed in ICs have their emitter, base and collector contacts on one side of the wafer (i.e. the wafer front side). However, polysilicon emitter based transistors having a collector contact on a side of the wafer opposite to the base and emitter contact (i.e. the wafer back side), thereby providing the transistor the capability of a high collector current for a given die size, have not yet been deployed in the field of discrete high current transistors such as bipolar transistors. The $I_C$ process requirements are such that, for a given die size, the current flows laterally in the collector region of the transistor and then back up to the wafer front for the contact. This causes the current gain curve to drop to a lower collector current $I_C$ since the possible emitter area is reduced and furthermore adds a resistance to the collector region since current is flowing laterally necessary to the collector contact on the front.

Aspects and embodiments of the disclosure have been devised with the foregoing in mind.

SUMMARY

According to an aspect of the present disclosure, there is provided bipolar transistor semiconductor device, comprising: a substrate layer; a collector epitaxial layer supported by the substrate layer; a base region supported by a portion of the collector epitaxial layer; and an emitter region supported by a portion of the base region, wherein the emitter region comprises a polysilicon material.

Optionally, the substrate layer may comprise Silicon (Si) doped with at least one of: Antimony (Sb); Arsenic (As); and Phosphorus (P).

Optionally, the substrate layer collector epitaxial layer may comprise Silicon (Si) doped with at least one of: Arsenic (As); and Phosphorus (P).

Optionally, the base region may comprise Silicon (Si) doped with Boron (B).

Optionally, the emitter region may comprise Silicon (Si), or polysilicon, doped with Arsenic (As).

Optionally, the emitter region may comprise Silicon (Si), or polysilicon, doped with Phosphorus (P).

Optionally, the device may further comprise a layer of Titanium (Ti) and/or Aluminium (Al), the layer supported by the collector epitaxial layer, the base region and the emitter region.

Optionally, the Titanium and/or Aluminium layer may further comprise Aluminium Silicon (AlSi) and/or Aluminium Silicon Copper (AlSiCu).

Optionally, the device may further comprise a layer of Aluminium Silicon (AlSi), the layer supported by the collector epitaxial layer, the base region and the emitter region.

Optionally, the device may further comprise a layer of Aluminium Silicon Copper (AlSiCu), the layer supported by the collector epitaxial layer, the base region and the emitter region.

Optionally, the device may comprise a back metal stack for assembly.

According to another aspect of the present disclosure, there is provided a method of fabricating a bipolar transistor semiconductor device comprising a substrate layer, a collector epitaxial layer, an emitter region and a base region, the method comprising: forming the collector epitaxial layer on a surface of the substrate layer; forming the base region on a portion of the of the collector epitaxial layer; and forming the emitter region on a portion of the base region, and wherein the emitter comprises a polysilicon material.

Optionally, forming the collector epitaxial layer on a surface of the substrate layer may comprise depositing a low doped N epitaxial layer on a highly doped N substrate.

Optionally, forming the base region on a portion of the collector epitaxial layer may comprise: forming an opening on a portion of collector epitaxial layer for the base region; and forming a plasma oxide layer on the opening portion of collector epitaxial layer to form the base region.

Optionally, forming the emitter region in a portion of the base region may comprise: removing a region in a portion of the base region; depositing a layer of polysilicon material in the region; and implanting the region with a high dose of a dopant to form the emitter region.

BRIEF DESCRIPTION OF THE DRAWINGS

For a more complete understanding of the present disclosure, reference is now made to the following description taken in conjunction with the accompanying drawings provided by way of non-limiting example only in which.

DETAILED DESCRIPTION

A step-by-step description of the fabrication process of a bipolar transistor according to one or more embodiments will now be provided with reference to FIGS. 2a to 2l, purely by way of example. In this example, the bipolar device is an NPN device. An equivalent PNP device can be achieved by simply interchanging dopants N and P.

Figure 1:
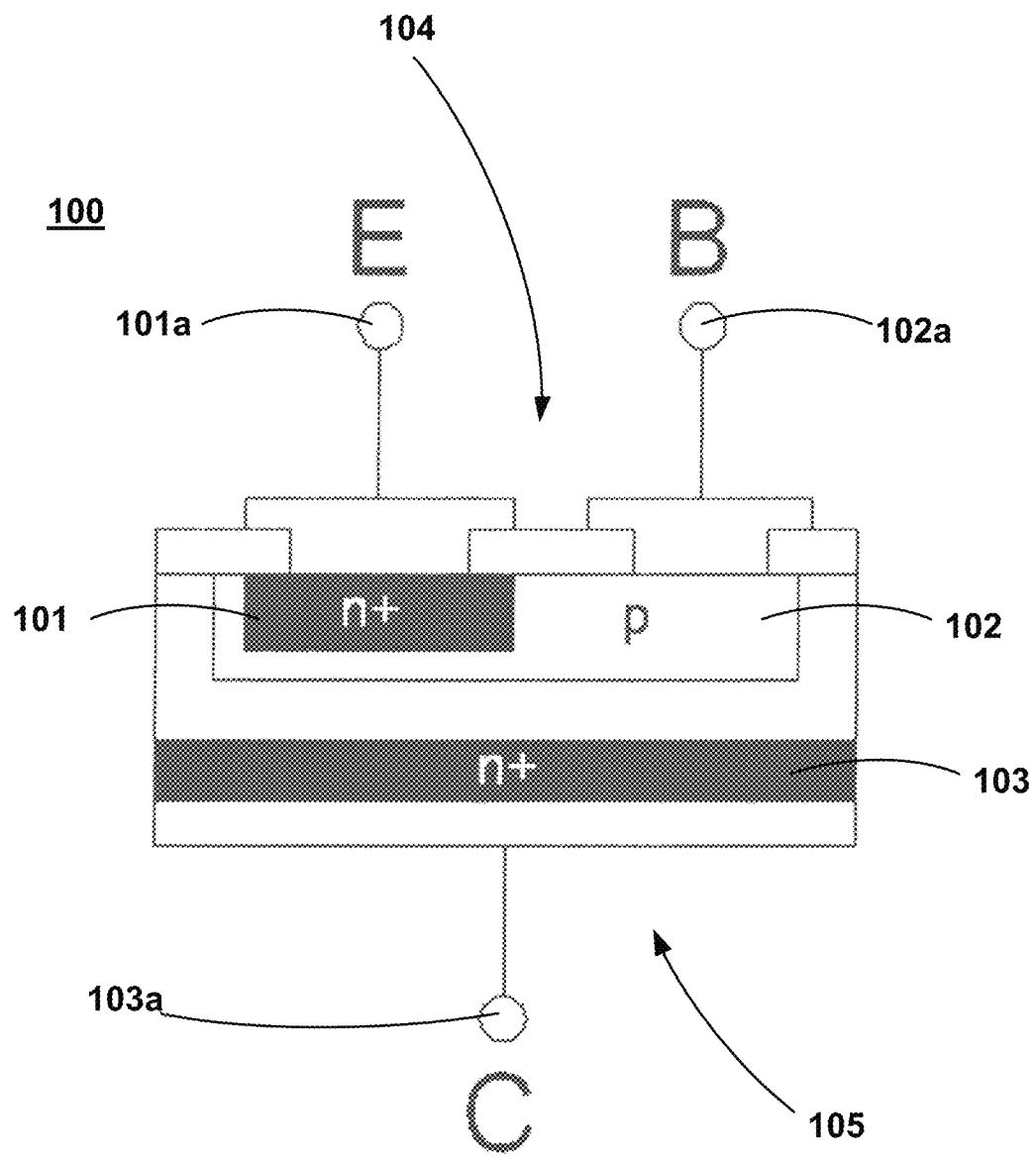
FIG. 1, which is prior art, shows a discrete bipolar transistor comprising an emitter region electrically coupled to an emitter terminal, a collector region electrically coupled to a collector terminal and a base region electrically coupled to a base terminal.
Figure 2A:
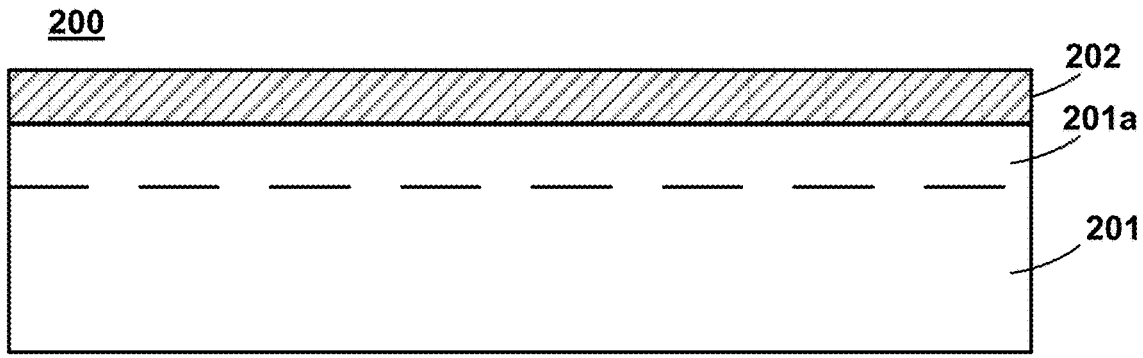
FIGS. 2a to 2l illustrate process steps for fabricating an NPN bipolar junction transistor semiconductor device in accordance with one or more embodiments of the present disclosure.

FIG. 2a illustrates a starting substrate 201 for fabricating a semiconductor device in accordance with an embodiment. At this stage, a collector epitaxial layer 201a is deposited on the top surface of the substrate 201 such that the semiconductor device may comprise a low-doped N collector epitaxial layer deposited on a highly-doped N substrate 201. The N doping in the substrate 201 is substantially higher than the N doping in the collector epitaxial layer by a factor of, for example, 10000 for a substrate resistivity in the range of about 1 mOhmcm-10 mOhmcm, i.e. ×10 e19 cm-3 and an epitaxial layer thickness of approximately ×10 e14 cm-3 to ×10 e15 cm-3. In this example, the high doping of the substrate 201 is necessary to achieve a low saturation voltage drop Vsat. The relation of substrate resistivity and substrate doping is given for N type. A first oxide layer 202 is formed on top of the low-doped N collector epitaxial layer. The first oxide layer 202 may be deposited on the top surface of the low-doped N collector epitaxial layer by any suitable technique or method. For example, the first oxide layer 202 may be thermally grown on the collector epitaxial layer. Other methods of forming the first oxide layer 202 may also be used such as chemical oxidation and electrically induced oxidation. The first oxide layer 202 may be formed of an electrically insulating material such as silicon oxide. However, the oxide layer formed of a silicon oxide is only an example and may be formed of another electrically insulating material.

Figure 2B:
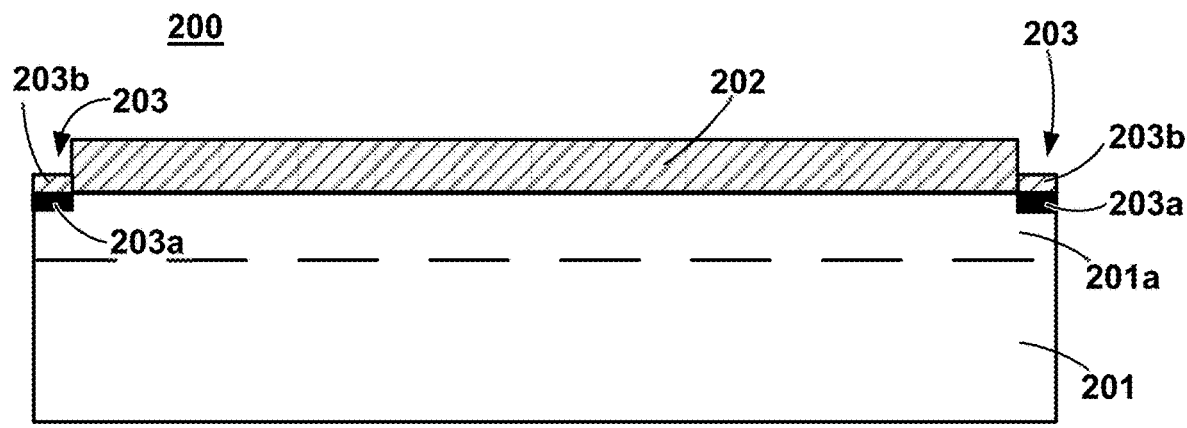

FIG. 2b illustrates two channel implants 203a formed at the periphery or part thereof of the first oxide layer 202 of the semiconductor wafer 200 as shown in FIG. 2a. Two channels 203 are first formed at the edges of the first oxide layer 202. The channels 203 may be formed by removing or opening the end portions of the first oxide layer 202, for example, using dry (plasma) etching, wet (chemical) etching, reactive ion etching (RIE) or any other suitable etching process. A thin scattering oxide layer 203b is grown on the base of each channel 203. Highly-doped N implants are made through the thin scattering oxide layers 203b by the process of ion or plasma implantation to form the two channel implants 203a. The channel implants may be used to prevent any cross talk between chips while on wafer and prevent leakage current flowing laterally from the collector to the base of the device. The channel implants 203a may optionally be formed at a different location on the first oxide layer 202, the location being dependent on the physical layout of the semiconductor wafer 200a.

Figure 2C:
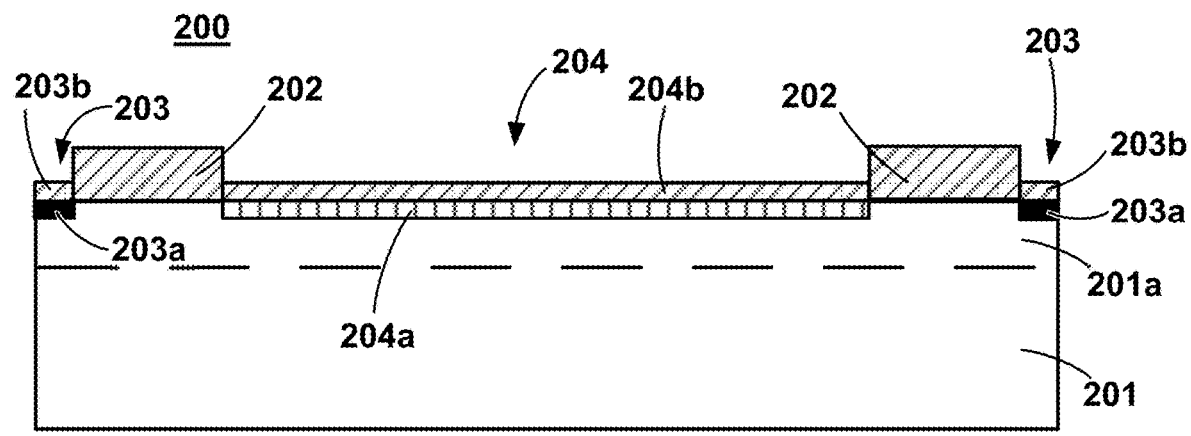

At the next stage, referring to FIG. 2c, an opening 204 for a base implant is formed on the semiconductor wafer 200 shown in FIG. 2b by etching away a portion of the first oxide layer 202, for example, using dry (plasma) etching, wet (chemical) etching, reactive ion etching (RIE) or any other suitable etching process. The opening for the base implant 204 is formed in between the channel implants 203a of the semiconductor wafer 200 as shown in FIG. 2c. A thin scattering oxide layer 204b is grown on the opening 204 for the base implant. The base implant 204a comprising a lowly-doped P implant is then formed through the thin scattering oxide layer 204b by ion or plasma implantation. The distance from base edge to channel diffusion should be chosen such that it is large enough to prevent lateral breakdown between base and collector of the device.

Figure 2D:
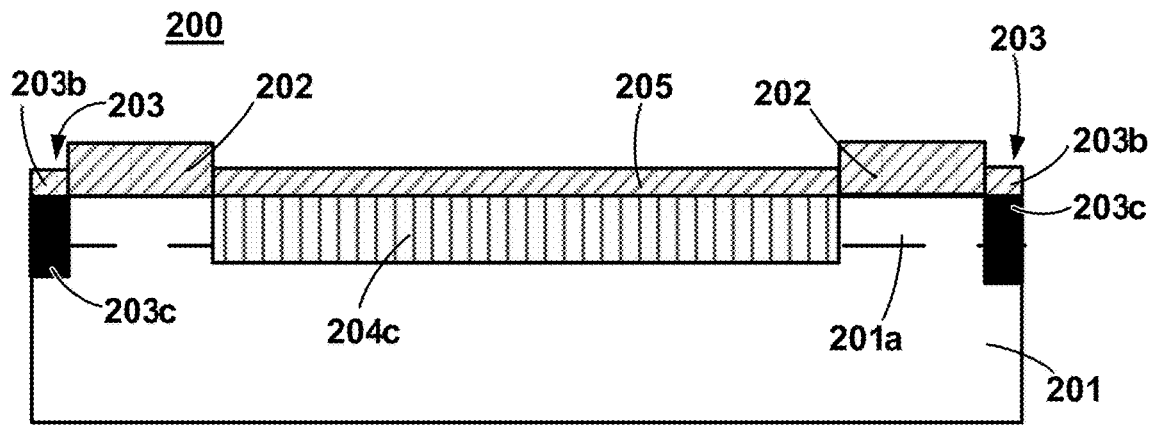

FIG. 2d illustrates a second oxide layer 205 formed on the top surface of the semiconductor wafer 200 as shown in FIG. 2c. At this stage, the second oxide layer 205 is formed on the semiconductor device such that the oxide layer coats the top surface of the semiconductor device, and is densified. A Plasma Enhanced Chemical Vapor Deposition PECVD may be used to form the oxide in order to keep the thermal budget low, i.e. to achieve shallow junctions. The second oxide layer 205 may be a plasma oxide layer. The plasma oxide layer may be grown and densified using any known process, for example, chemical oxidation and electrically induced oxidation.

Figure 2E:
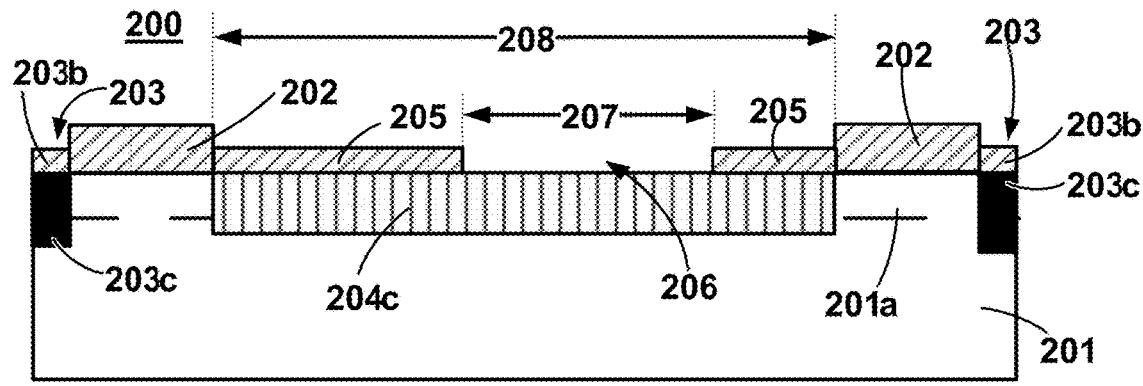

FIG. 2e illustrates another opening 206 formed on the surface of the base region 208 of the semiconductor wafer 200 of FIG. 2d for an emitter region 207. The opening 206 is formed by etching away a portion of the second oxide layer 205, for example, dry (plasma) etching, wet (chemical) etching, reactive ion etching (RIE) or any other suitable etching process. A purpose of the opening 206 is to receive the body of the emitter region 207, which will be described in the following paragraphs. The emitter opening may be a single area as illustrated by opening 206 or as a mesh of oxide pillars within the emitter region (not shown), where base contacts may be made.

Figure 2F:
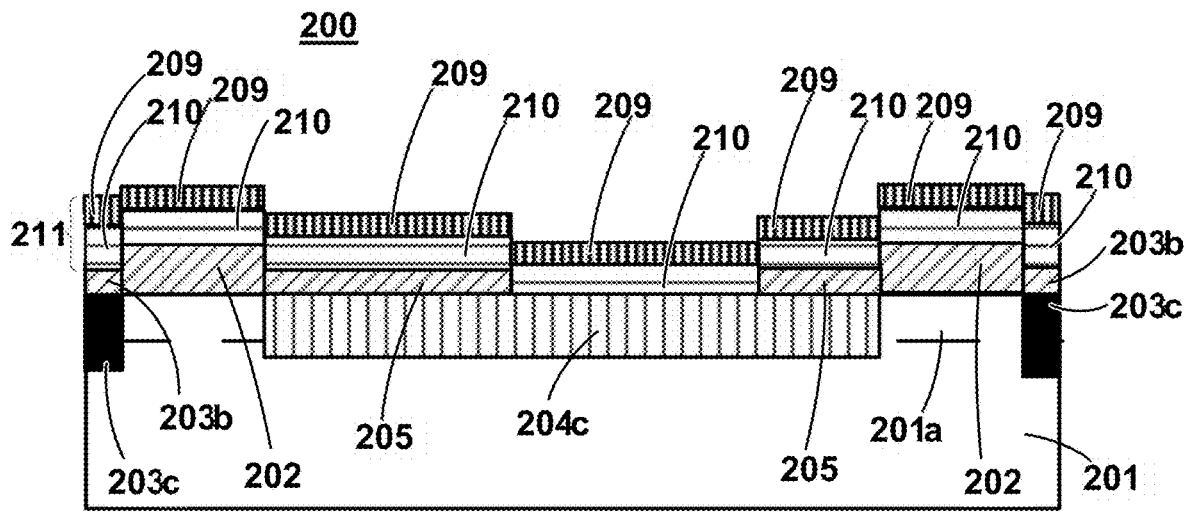

FIG. 2f illustrates a polysilicon layer 211 formed on the top surface of the semiconductor wafer 200 of FIG. 2e. The polysilicon layer 211 comprises two layers, an upper layer 209 and a lower layer 210 as shown in FIG. 2f. In optional embodiments, the polysilicon layer 211 may comprise any number of polysilicon layers. In this example, the lower layer 210 of the polysilicon layer 211 is a layer of undoped polysilicon. The lower layer 210 is first deposited on the top surface of the semiconductor wafer 200 of FIG. 2e. The upper layer 209 of the polysilicon layer 211 is then deposited and implanted with a high dose of N dopant, forming an N doped layer. The polysilicon layer 211 is then driven in, causing the N dopant in the upper layer 209 to diffuse into the lower layer 210.

At the next stage, unwanted polysilicon formed in the previous stage, that is, the polysilicon portions what are not part of the emitter may be removed from the semiconductor wafer 200 in FIG. 2f. At this stage, the polysilicon layer 211 may be structured such that only the portion of polysilicon layer 211 forming the emitter region 207 of the semiconductor wafer 200 shown in FIG. 2g remains, that is, polysilicon emitter layer. The polysilicon layer 211 may be structured using any suitable technique or method.

Figure 2G:
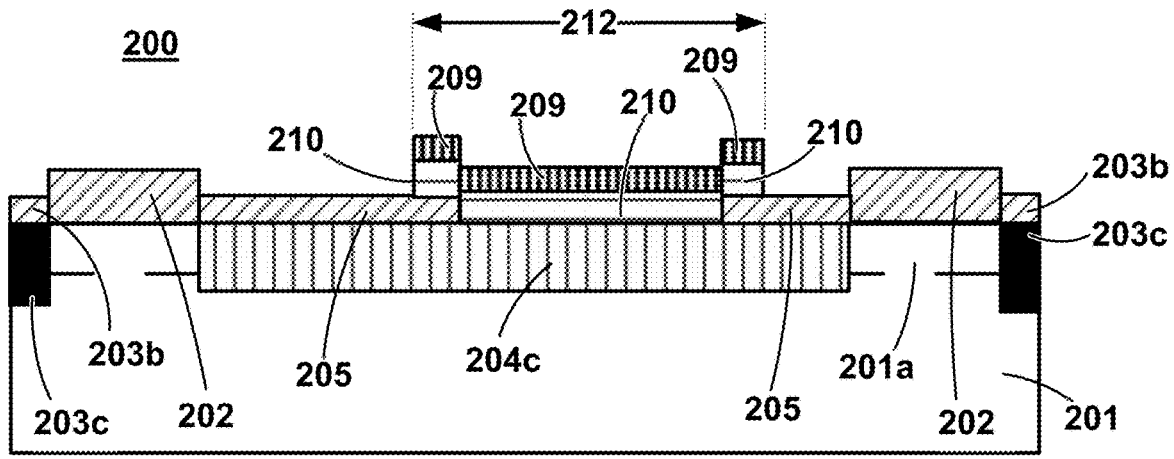
Figure 2H:
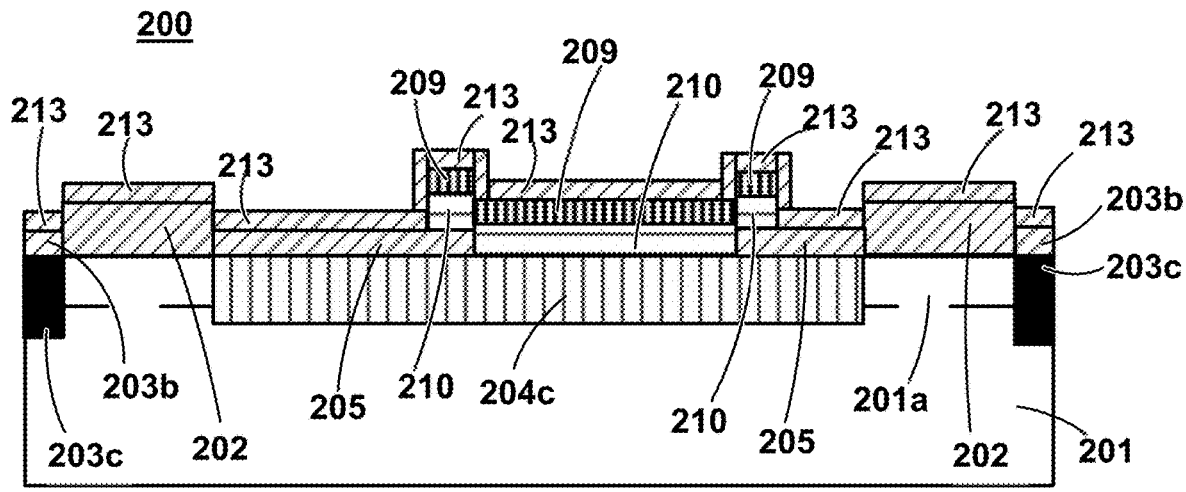

At the next stage, as illustrated in FIG. 2h, a third oxide layer 213 is formed on the exposed top surface of the semiconductor wafer 200 of FIG. 2g. The oxide layer is a plasma oxide layer formed by plasma oxidation. Other methods of forming an oxide layer may also be used such as chemical oxidation and electrically induced oxidation.

Figure 2I:
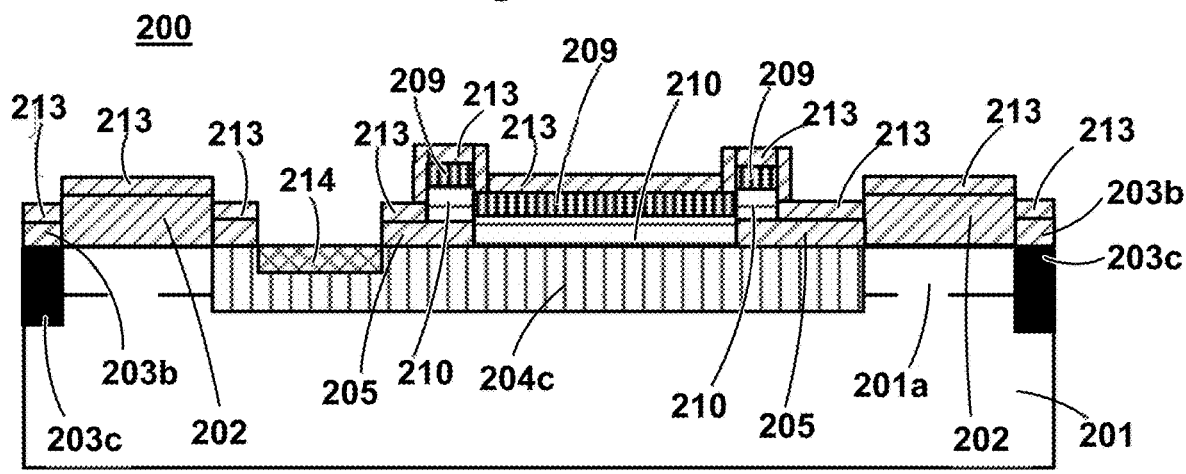

FIG. 2i illustrates an opening 214 formed within the base region 208 of the semiconductor wafer 200 in FIG. 2h for a base contact diffusion. The opening 214 is etched into the base region 208, for example, by dry (plasma) etching, wet (chemical) etching, reactive ion etching (RIE) or any other suitable etching process. A purpose of the opening 214 is to receive a base contact diffusion implant of P dopant with higher doping than the base region.

Figure 2J:
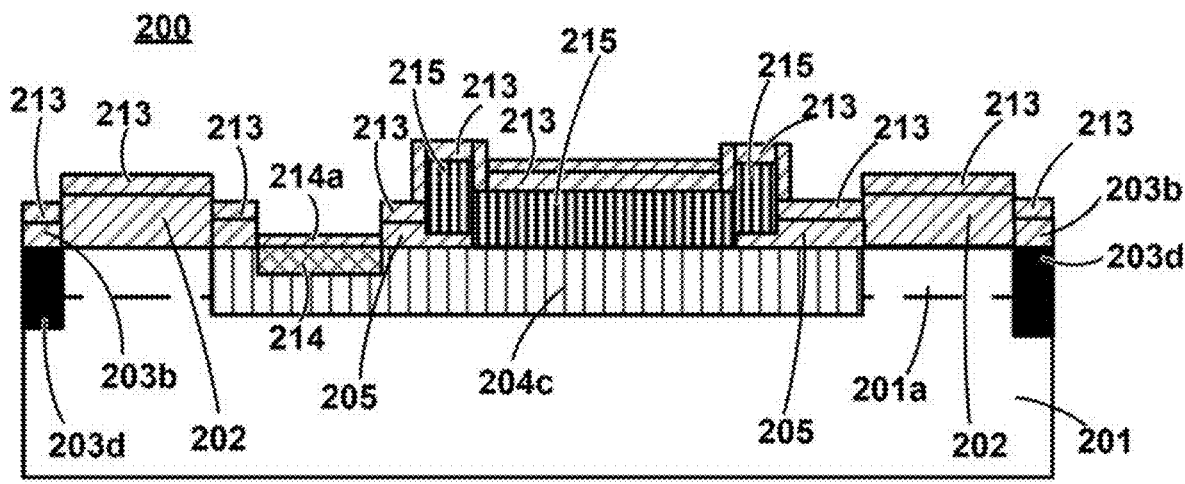

At the next stage, referring to FIG. 2j, the base contact diffusion implant 214a is implanted into the opening 214 using ion or plasma implantation. At this stage, all dopants in the semiconductor wafer 200 as shown in FIG. 2i are diffused into respective regions of the semiconductor wafer 200. The polysilicon is protected from p implant by the oxide. The diffusion may be performed in a single step or in multiple steps. The diffusion process results in the emitter polysilicon layer 212 being fully doped 215.

Figure 2K:
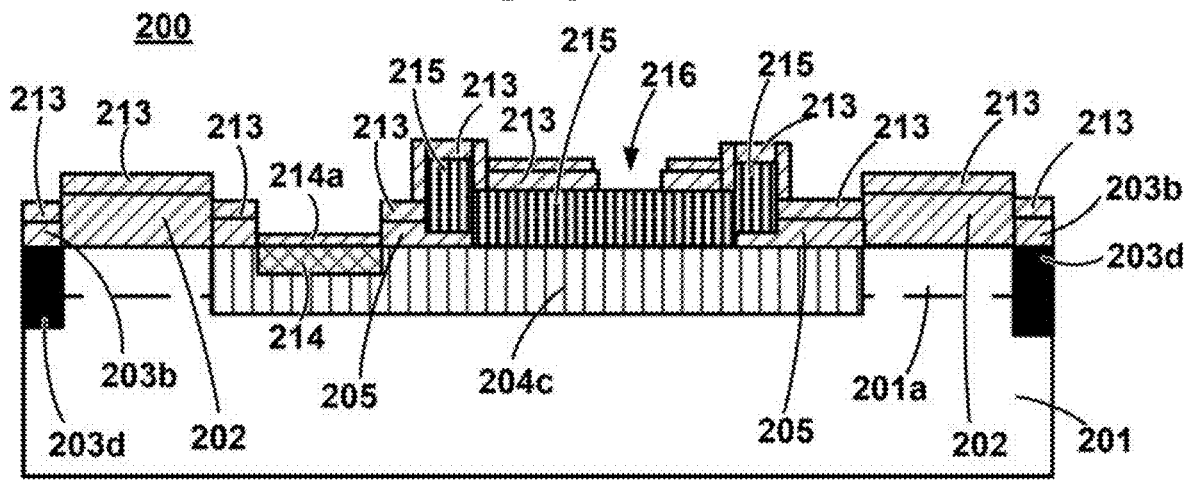

At the next stage, referring to FIG. 2k, an opening 216 is formed on the top surface of the emitter region 207 of the semiconductor wafer 200 shown in FIG. 2j. The opening 216 is formed by etching for example, dry (plasma) etching, wet (chemical) etching, reactive ion etching (RIE) or any other suitable etching process. The opening 216 is formed to receive a metal alloy to contact the fully doped emitter polysilicon layer 215. The metal alloy comprises conductive material such as titanium (Ti), aluminium (Al) or a combination thereof. Other suitable conductive material may also be used. At this stage, the base contact is opened by a short acid dip to remove any unwanted oxides formed on the semiconductor device. The acid comprises dilute hydrofluoric (HF) acid or any suitable acid or acids. Since the oxide in the base contact is thinner than the oxide on the polysilicon, only the opening for emitter contact is formed on the polysilicon. Otherwise the base contact would be heavily over etched. A short acid dip at this stage ensures that the base contact opening is oxide free, in preparation for the next process step.

Figure 2L:
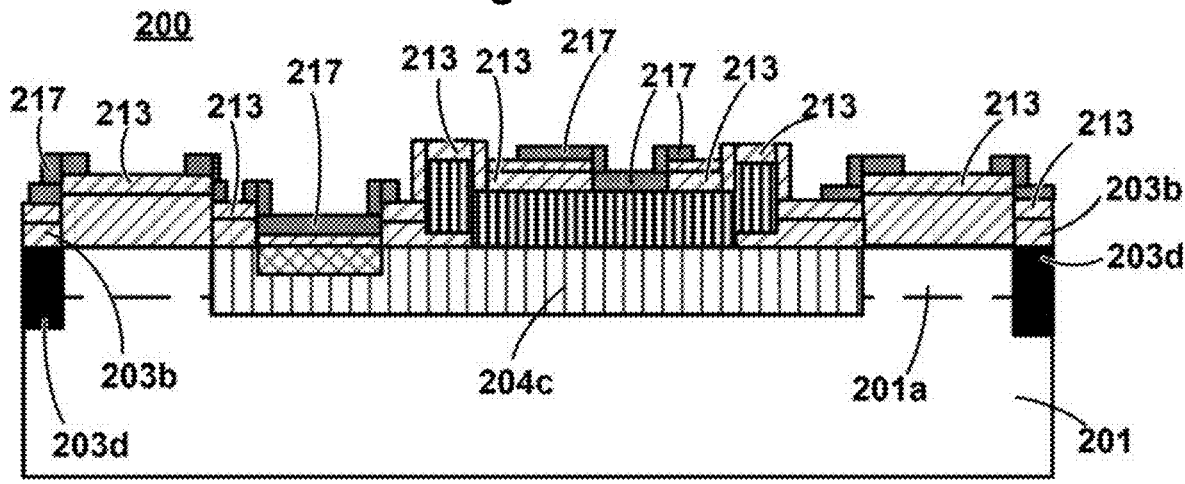

At a final stage, referring to FIG. 2l, conductive materials 217 are deposited on the top surface of the semiconductor wafer 200 as shown in FIG. 2k. The conductive materials 217 are deposited by sputtering and structured as shown in FIG. 2l. The sputter deposition used may be, for example, ion-beam deposition, ion-assisted deposition, reactive or gasflow sputtering, High-target-utilization sputtering (Hi-TUS) or High-power impulse magnetron sputtering (HiP-IMS). The conductive materials 217 may comprise titanium Ti and aluminium Al. Other suitable conductive materials may also be used. Passivation is then deposited on the top surface of the semiconductor wafer 200 in FIG. 2k and structured. A suitable back metal stack for assembly is then applied to the top layer of the semiconductor wafer 200 to form the bipolar transistor semiconductor device 200 in FIG. 2l in accordance with an embodiment.

According to the present disclosure, a polysilicon emitter is applied to a discrete bipolar transistor device having a collector on the device wafer back side, that is, where the collector is located on the same (wafer back) side as the base and emitter of the device. This may be achieved as disclosed above by implanting a shallow base into the collector epitaxial layer, depositing polysilicon onto the emitter region, implanting the polysilicon regions and gently diffusing in the emitter from the polysilicon into the silicon in one step.

According to the present disclosure, a polysilicon emitter is applied to a bipolar transistor semiconductor device having a collector on the device wafer back side. The bipolar transistor semiconductor device comprises a substrate layer supporting a collector epitaxial layer. The device further comprises a base region, which is supported by a portion of the collector epitaxial layer. The base region of the device supports an emitter region which is comprised of a polysilicon material. A terminal comprising Ti and Al extends from each one of the collector epitaxial layer, the base region and the emitter region.

The thermal budget of a bipolar transistor having such a device structure may reduce by approximately a third or a half of conventional bipolar transistors of similar ratings as a result thereby allowing for a hFE larger or equal to 1000 without being limited by process spread. The bipolar transistor can also enter saturation at high collector current IC when driven by only a very small base current IB. The high emitter doping from the emitter (i.e. having a high emitter Gummel number emitter) and the very well controlled narrow and lowly doped base (i.e. having a low base Gummel number base) achieve a high hFE. As a result of achieving a very low device thermal budget the process spread is kept a minimum even for an extremely narrow base.

The operation of the proposed semiconductor device is similar to that for a standard BJT. However, due to the increased hFE (i.e. approximately double that of an equivalent conventional bipolar transistor) of the semiconductor device as a consequence of the structural design, a base current that is approximately half that of the equivalent conventional bipolar transistor may be sufficient to bring the semiconductor device to saturation for a given collector current IC. As the base current is required to flow across 0.7V VBE, the device power losses can be substantial for a power transistor. For example, consider a 15A rated bipolar transistor requiring a 1 A base current at IC=15 A to keep the transistor in saturation mode. This would result in a power loss of (I*V=1 A*0.7V=700 mW) across the BE diode (base-emitter diode). In this example, by providing a bipolar transistor with double the hFE, the IV power losses across the BE diode can be halved, that is 0.5 A*0.7V=350 mW instead.

In at least one embodiment, the bipolar transistor semiconductor device 200 of FIG. 2/ according to embodiments is suitable for use in high power applications where high current amplification and device energy efficiency is required but where packaging space is limited. That is, a BJT device that is capable to handle high load currents but is also compact in size, that is, possesses a small device footprint in a thermally efficient package.

In the automotive industry, BJTs may be deployed in various on-board electronic systems, for example, as a load switch in airbag deployment, as pre-drivers to drive high current Trench MOSFETs typically used in fuel pumps, in over-voltage protection, in low drop-out regulation, in LED backlight switching, and in Royer converters for LCD backlights in the instrument cluster. The bipolar transistor semiconductor device 200 of FIG. 2/ may be suited for deployment in any of the above applications and be able to handle high load current applications but at the same time be energy efficient and compact, thereby taking up very little packaging space in the vehicle.

Features which are described in the context of separate embodiments may also be provided in combination in a single embodiment. Conversely, various features which are, for brevity, described in the context of a single embodiment, may also be provided separately or in any suitable sub combination.

Term "comprising" does not exclude other elements or steps, the term "a" or "an" does not exclude a plurality. Reference signs in the claims shall not be construed as limiting the scope of the claims.

In view of the foregoing description it will be evident to a person skilled in the art that various modifications may be made within the scope of the disclosure.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

What is claimed is:

1. A bipolar transistor semiconductor device, comprising:
a substrate layer;
a collector epitaxial layer supported directly on the substrate layer;
a base region is supported by a portion of the collector epitaxial layer, the base region being formed in the collector epitaxial layer;
an emitter region supported by a portion of the base region, wherein the emitter region comprises a polysilicon material; and
a layer of Titanium (Ti) and/or Aluminium (Al), wherein the layer of Titanium (Ti) and/or Aluminium (Al) is supported by the collector epitaxial layer, the base region and the emitter region, and wherein the Titanium and/or Aluminium layer further comprises AlSi and/or AlSiCu.

2. The bipolar transistor semiconductor device according to claim 1, wherein the substrate layer further comprises Silicon (Si) doped with at least one element from the group consisting of Antimony (Sb), Arsenic (As), and Phosphorus (P).

3. The bipolar transistor semiconductor device according to claim 1, wherein the substrate layer and the collector epitaxial layer further comprises Silicon (Si) doped with at least one element from the group consisting of Arsenic (As) and Phosphorus (P).

4. The bipolar transistor semiconductor device according to claim 1, wherein the base region further comprises Silicon (Si) doped with Boron (B).

5. The bipolar transistor semiconductor device according to claim 1, wherein the emitter region further comprises Silicon (Si), or polysilicon, doped with Arsenic (As).

6. The bipolar transistor semiconductor device according to claim 1, wherein the emitter region further comprises Silicon (Si), or polysilicon, doped with Phosphorus (P).

7. The bipolar transistor semiconductor device according to claim 1, further comprising a layer of AlSi, wherein the layer of AlSi is supported by the collector epitaxial layer, the base region and the emitter region.

8. The bipolar transistor semiconductor device according to claim 1, further comprising a layer of AlSiCu, wherein the layer of AlSiCu is supported by the collector epitaxial layer, the base region and the emitter region.

9. The bipolar transistor semiconductor device according to claim 1, further comprising a back metal stack for assembly.

10. A method of fabricating a bipolar transistor semiconductor device comprising a doped substrate layer, a collector epitaxial layer, an emitter region and a base region, the method comprising the steps of:
forming the collector epitaxial layer directly on a surface of the substrate layer such that the collector epitaxial layer has a higher doping concentration of the same type as the doped substrate layer;
forming the base region on a portion of the of the collector epitaxial layer so that the base region is formed in the collector epitaxial layer; and
forming the emitter region comprising a polysilicon material on a portion of the base region, and
forming a layer of Titanium (Ti) and/or Aluminium (Al), wherein the layer of Titanium (Ti) and/or Aluminium (Al) is supported by the collector epitaxial layer, the base region and the emitter region, and wherein the Titanium and/or Aluminium layer further comprises AlSi and/or AlSiCu.

11. The method of claim 10, wherein forming the collector epitaxial layer on a surface of the substrate layer further comprises the step of depositing a low doped N epitaxial layer on a highly doped N substrate.

12. The method of claim 10, wherein forming the base region on a portion of the of the collector epitaxial layer further comprises the steps of:
- forming an opening on a portion of the collector epitaxial layer for the base region; and
- forming a plasma oxide layer on the opening portion of the collector epitaxial layer to form the base region.

13. The method of claim 10, wherein forming the emitter region in a portion of the base region further comprises the steps of:
- removing a region in a portion of the base region;
- depositing a layer of polysilicon material in the region; and
- implanting the region with a high dose of a dopant to form the emitter region.

\* \* \* \* \*